United States Patent [19]

Sawamura

[11] Patent Number: 5,210,503
[45] Date of Patent: May 11, 1993

[54] AMPLITUDE LIMITING AMPLIFIER CIRCUIT

[75] Inventor: Yo Sawamura, Ohtsu, Japan

[73] Assignee: Rohm Co., Ltd., Kyoto, Japan

[21] Appl. No.: 821,075

[22] Filed: Jan. 16, 1992

[30] Foreign Application Priority Data

Jan. 23, 1991 [JP] Japan .................................. 3-022816

[51] Int. Cl.$^5$ ........................................... H03G 11/04
[52] U.S. Cl. ..................................... 330/110; 307/568
[58] Field of Search ................ 330/110; 307/249, 562, 307/568

[56] References Cited

U.S. PATENT DOCUMENTS 4,849,708 7/1989 Brehmer et al. ..................... 330/110

Primary Examiner—James B. Mullins
Attorney, Agent, or Firm—Fay, Sharpe, Beall, Fagan, Minnich & McKee

[57] ABSTRACT

A MOSFET whose back gate area is independent of a substrate is employed as a level-slicing transistor which is simultaneously used for alternately turning ON and turning OFF four analog switches in accordance with the relation between the voltages of the output terminal and inverted input voltage of the output terminal is limited to $V_B \pm V_{th}$, where $V_{th}$ is the amplitude at the threshold level of the levelslicing transistor and $V_B$ is the bias voltage.

7 Claims, 3 Drawing Sheets

# AMPLITUDE LIMITING AMPLIFIER CIRCUIT

BACKGROUND OF THE INVENTION

1. Technical Field

The present invention relates to amplitude limiting amplifier circuits and more particularly to improvements in amplitude limiting amplifier circuits for amplifying such kinds of sensor signals for use in VTRs and video movies as frequency signals (FG) for indicating rotational speeds of drums and capstans, and control signals (CTL) to be read from magnetic tapes.

2. Background Art

A conventional amplitude limiting amplifier circuit of the sort described above comprises an amplifier and an amplitude limiting circuit. FIG. 5 shows an example of the amplitude limiting amplifier circuit. An operational amplifier 1 in FIG. 5 is an inverted amplifier in which bias voltage VB is applied to a non-inverted input terminal 2, whereas a signal to be amplified is input to an inverted input terminal 3 via a capacitor 4 and a resistor $R_2$ which are used for cutting direct current. A feedback resistor $R_1$ is connected between an output terminal 5 and the inverted input terminal 3. An amplitude limiting circuit 6 has a pair of parallel diodes 7, 8 and is connected to the feedback resistor $R_1$. The diode 7 is connected in the direction in which forward current flows from the inverted input terminal 3 to the output terminal 5, whereas the diode 8 is connected in the opposite direction.

With the arrangement above, the voltage of the output terminal 5 varies in such a way as to center around the bias voltage VB when the input signal is amplified by the operational amplifier 1. The forward current flows through the diode 7 when the voltage of the output terminal 5 becomes higher than that of the inverted input terminal 3, thus causing the potential difference to reach the forward voltage drop Vf of the diode. The maximum voltage value of the output terminal 5 is thus limited to VB+Vf. On the other hand, the forward current flows through the diode 8 when the voltage of the output terminal 5 becomes lower than that of the inverted input terminal 3, thus causing the potential difference to reach Vf. The minimum voltage value of the output terminal 5 is thus limited to VB−Vf. Therefore, the signal output from the output terminal 5 is what has amplitude Vf centering around the bias voltage VB.

However, the following problems are posed when a CMOS integrated circuit is used to form the conventional amplitude limiting amplifier circuit. Although the diodes 7, 8 are required to be independent of other peripheral circuits, they can hardly be kept afloat in ordinary CMOS processing. In order to make the diodes 7, 8 afloat in such CMOS processing, insulating films or insulating layers will have to be formed to provide a multilayer construction and this attempt may otherwise result in not only lowering the integration ratio of the circuit but also complicating the process of manufacture.

FIG. 6 shows another example of the conventional amplitude limiting amplifier circuit. An amplitude limiting circuit 9 in this circuit has a pair of P-channel MOSFETs 10, 11 The drain terminal of the P-channel MOSFET (hereinafter called "PMOS") 10 and the source terminal of PMOS 11 are connected to the inverted input terminal 3 of an operational amplifier 1, whereas the source terminal of the PMOS 10 and the drain terminal of the PMOS 11 are connected to the output terminal 5 of the operational amplifier 1. Moreover, the gate terminal of the PMOS 10 is connected to the inverted input terminal 3, whereas the gate terminal of the PMOS 11 is connected to the output terminal 5.

The voltage of the output terminal 5 varies in such a way as to center around bias voltage VB in response to an input signal in that case as well. In other words, current flows from the source to drain of the PMOS 10 when the voltage of the output terminal 5 becomes higher than that of the inverted input terminal 3, thus causing the potential difference to reach the threshold level $Vth_1$ of the PMOS 10. The maximum voltage value of the output terminal 5 is consequently limited to VB+$Vth_1$. On the other hand, the current flows from the source to drain of the PMOS 11 when the voltage of the output terminal 5 becomes lower than that of the inverted input terminal 3, thus causing the potential difference to reach the threshold level $Vth_2$ of the PMOS 10. The minimum voltage value of the output terminal 5 is consequently limited to VB+$Vth_2$.

However, the back gate voltages of the PMOSs 10, 11 are both locked to power supply voltage $V_{DD}$. The source-to-drain potential difference (=threshold level $Vth_1$) resulting from the flow of the current from the source to drain of the PMOS 10 when the voltage of the output terminal 5 becomes higher than the voltage VB of the inverted input terminal 3 in the circuit above differs from the source-to-drain potential difference (=threshold level $Vth_2$) resulting from the flow of the current from the source to drain of the PMOS 11 when the voltage of the output terminal 5 becomes lower than the voltage VB of the inverted input terminal 3. The threshold levels $Vth_1$, $Vth_2$ thus differ from each other. This amplitude limiting amplifier circuit is incapable of amplifying the input signal in such a way as to limit the amplitude evenly in the vertical direction (=output level direction). The PMOSs 10, 11 may be replaced with respective N-channel MOSFETs (hereinafter called "NMOS"); however, the back gate voltages of both are locked to GND (0[V]) in this case. For this reason, the threshold levels $Vth_1$, $Vth_2$ still remain uneven and therefore the amplitude cannot also be limited evenly in the vertical direction.

SUMMARY OF THE INVENTION

An amplitude limiting amplifier circuit according to the present invention is characterized by a level-slicing MOSFET whose back gate terminal is kept afloat off a substrate and whose source or drain terminal is connected to the inverted input terminal of an operational amplifier, the other alternative terminal being connected to the output terminal of the operational amplifier. Moreover, a first analog switch is connected between the gate terminal of the MOSFET and the inverted input terminal of the operational amplifier, whereas a second analog switch is connected between the gate terminal thereof and the output terminal. Further, a third analog switch is connected between the back gate and the inverted input terminal, whereas a fourth analog switch is connected between the back gate and the output terminal.

If a P-channel MOSFET is employed in this case, the first and the fourth analog switch are turned off and the second and the third analog switch are turned on when the voltage of the output terminal is lower than that of the inverted input terminal. Inversely, the first and the fourth analog switch are turned on and the second and the third analog switch are turned off when the voltage of the output terminal is higher than that of the inverted input terminal.

If a N-channel MOSFET is employed then, the first and the fourth analog switch are turned on and the second and the third analog switch are turned off when the voltage of the output terminal is lower than that of the inverted input terminal. Inversely, the first and the fourth analog switch are turned off and the second and the third analog switch are turned on when the voltage of the output terminal is higher than that of the inverted input terminal.

While the MOSFET with the back gate area independent of the substrate is used as a level-slicing transistor, no additional transistor is rendered unnecessary by alternately turning on and off the four analog switches in conformity with the relation between the voltages of the output terminal and inverted input terminal of the operational amplifier. As a result, the amplitude is limited by the threshold level Vth of the level-slicing transistor and the amplitude of a signal to be amplified is evenly limited in the vertical direction. As is obvious from the circuit arrangement described above, the amplitude limiting amplifier circuit includes no diodes and can limit the amplitude using one MOS transistor. It is possible to make the MOS transistor afloat off the substrate through ordinary CMOS processing. The amplitude limiting amplifier circuit according to the present invention may therefore be produced through a manufacturing process simpler than what is employed for forming a diode through bipolar processing. Since one MOS transistor is used to limit the amplitude, vertical uniformity is prevented from being spoiled by variations of elements as in a case where diodes or the like are employed through the bipolar processing.

An object of the present invention is therefore to provide an amplitude limiting amplifier circuit capable of limiting the amplitude evenly in the vertical direction.

Another object of the present invention is to provide an amplitude limiting amplifier circuit which is producible through ordinary CMOS processing, capable of limiting the amplitude evenly in the vertical direction and fit for integration.

DESCRIPTION OF THE PREFERRED EMBODIMENT

Figure 1:
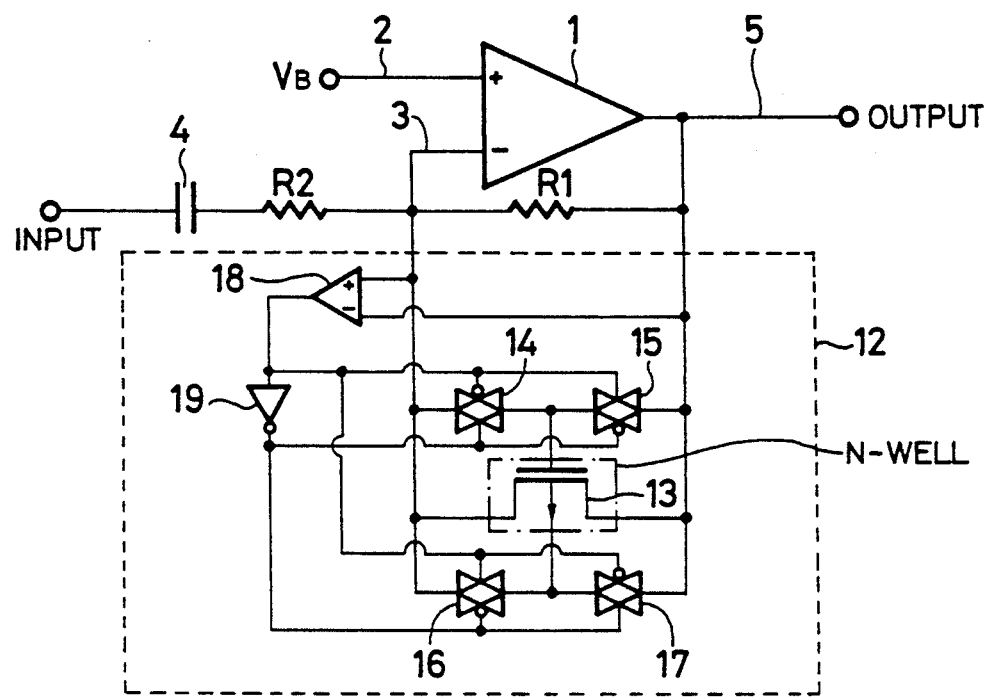
FIG. 1 is a circuit diagram of an amplitude limiting amplifier circuit embodying the present invention.

As shown in FIG. 1, PMOS 13 is connected in parallel to a feedback resistor $R_1$ between the inverted input terminal 3 and output terminal 5 of an operational amplifier 1. The PMOS 13 is formed in the N-well region of a substrate. The back gate area (well region) is kept floating with respect to the substrate and connected to a back gate terminal. A first analog switch 14 is connected between the gate terminal of the PMOS 13 and the inverted input terminal 3, whereas a second analog switch 15 is connected between the gate terminal of the PMOS 13 and the output terminal 5. Moreover, a third analog switch 16 is connected between the back gate terminal of the PMOS 13 and the inverted input terminal 3, whereas a fourth analog switch 17 is connected between the back gate terminal of the PMOS 13 and the output terminal 5. In this case, either the source or drain terminal of the PMOS 13 is connected to the inverted input terminal of the operational amplifier, the other alternative terminal being connected to the output terminal 5 of the operational amplifier.

A comparator 18 compares the voltages of the inverted input terminal 3 and the output terminal 5 and outputs a LOW-level (hereinafter called "L") signal when that of the output terminal 5 is higher and a HIGH-level (hereinafter called "H") signal when that of the inverted input terminal 3 is higher. The output is applied to an invertor 19.

The output of the comparator 18 is subsequently applied to the inverted input terminals for "ON/OFF" control of the first and the fourth analog switch 14, 17 and to the non-inverted input terminals for "ON/OFF" control of the second and the third analog switch 15, 16, respectively. The output of the invertor 19 is inversely applied to the non-inverted input terminals for "ON/OFF" control of the first and the fourth analog switch 14, 17 and to the inverted input terminals for "ON/OFF" control of the second and the third analog switch 15, 16, respectively.

When the voltage of the output terminal 5 is higher than that of inverted input terminal 3, the comparator 18 and the invertor 19 operate to turn on the first and the fourth analog switch 14, 17 and to turn off the second and the third analog switch 15, 16. When the voltage of the output terminal 5 is lower than that of inverted input terminal 3, the comparator 18 and the invertor 19 operate to turn off the first and the fourth analog switch 14, 17 and to turn on the second and the third analog switch 15, 16.

In FIG. 1, it is assumed that the terminal on the source side of the PMOS 13 is connected to the output terminal 5 and that the terminal on the drain side thereof to the inverted input terminal 3. As the source and drain regions of the PMOS 13 are actually symmetrically formed in the N-well region, either one may be used as the source with the other as the drain. In other words, it is practically unnecessary for the source and the drain to be distinguished accordingly.

Figures 2A, 2B:
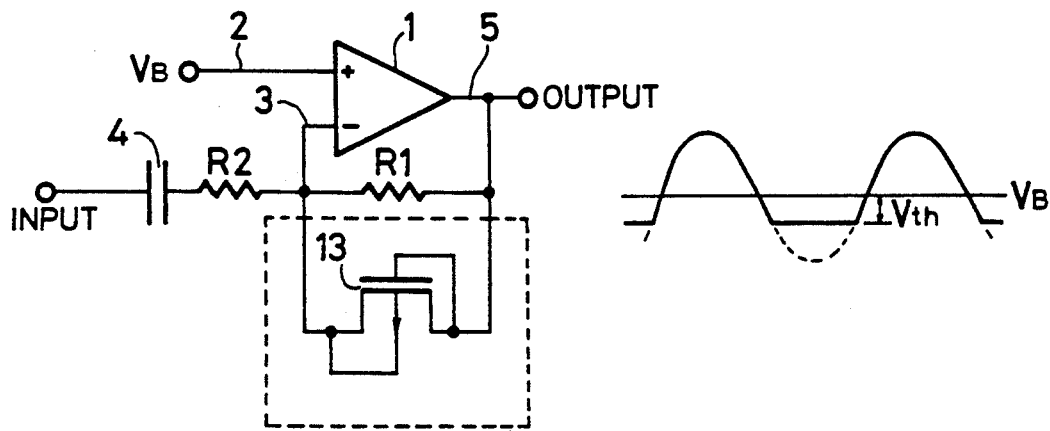
FIG. 2(a) shows an equivalent circuit for the amplitude limiting amplifier in the case where the voltage of the output terminal is lower than that of the inverted input terminal and FIG. 2(b) shows an output waveform as produced when a sine wave is input to the circuit of FIG. 2(a).

FIG. 2(a) shows an equivalent circuit in the amplitude limiting amplifier circuit when the voltage of the output terminal 5 is lower than that of the inverted input terminal 3. FIG. 2(b) shows an output waveform when a sine wave is input to the circuit of FIG. 2(a). The output of the comparator 18 is held at "H" and that of the invertor 19 at "L" when the voltage of the output terminal 5 is lower than that of the inverted input terminal 3. Consequently, the first and the fourth analog switch 14, 17 are turned off, whereas the second and the third analog switch 15, 16 are turned on. In other words, the PMOS 13 is in such a state that the back gate terminal is connected to the inverted input terminal 3 and the gate terminal to the output terminal 5. The back gate terminal is set at a high voltage on the side of the inverted input terminal 3 downward from voltage VB, whereas the gate terminal is set at a low voltage on the side of the output terminal 5. In operation, the drain side connected to the inverted input terminal 3 set at the high voltage is used as the source and the source side connected to the output terminal 5 set at the low voltage is used as the drain when the gate and the source are situated on the low voltage side while the drain and the back gate are situated on the high voltage side.

Therefore, current flows from the inverted input terminal 3 via the PMOS 13 to the output terminal 5 when the potential difference between the output terminal 5 and the inverted input terminal 3 reaches a threshold level Vth. The minimum voltage value of the output terminal 5 is consequently limited to VB−Vth.

Figure 3A:
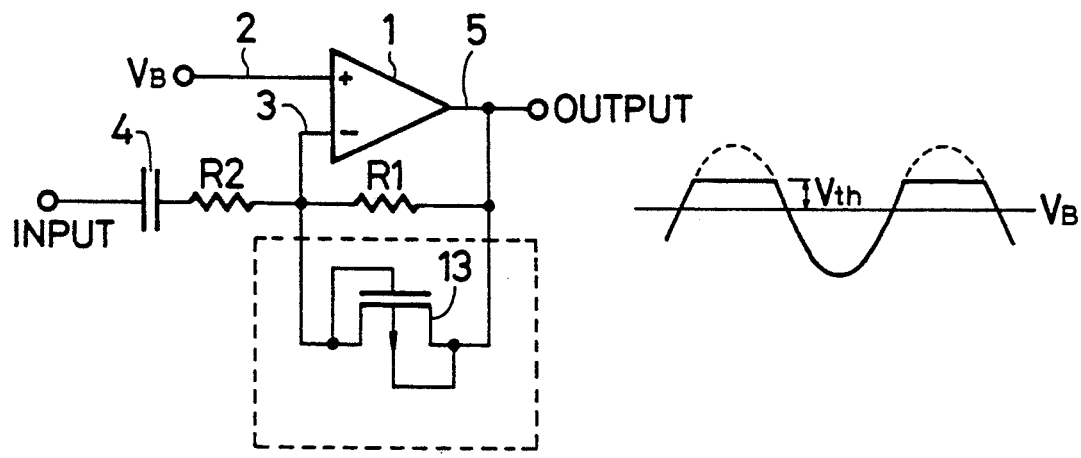
FIG. 3(a) shows an equivalent circuit for the amplitude limiting amplifier in the case where the voltage of the output terminal is higher than that of the inverted input terminal and FIG. 3(b) shows an output waveform as produced when a sine wave is input to the circuit of FIG. 3(a).
Figure 3B:
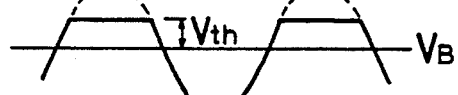

FIG. 3(a) shows an equivalent circuit in the amplitude limiting amplifier circuit when the voltage of the output terminal 5 is higher than that of the inverted input terminal 3. FIG. 3(b) shows an output waveform when a sine wave is input to the circuit of FIG. 3(a) likewise. The output of the comparator 18 is held at "H" and that of the invertor 19 at "L" when the voltage of the output terminal 5 is higher than that of the inverted input terminal 3. Consequently, the first and the fourth analog switch 14, 17 are turned on, whereas the second and the third analog switch 15, 16 are turned off. In other words, the PMOS 13 is in such a state that the back gate terminal is connected to the output terminal 5, and the gate terminal to the inverted input terminal 3. The back gate terminal is set at a high voltage on the side of the output terminal 5 upward from the voltage VB, whereas the gate terminal is set at a low voltage on the side of the inverted input terminal 3. The source and the back gate are situated on the high voltage side while the gate and the drain are situated on the low voltage side.

Therefore, the current flows from the output terminal 5 via the PMOS 13 to the inverted input terminal 3 when the potential difference between the output terminal 5 and the inverted input terminal 3 reaches the threshold level Vth. The maximum voltage value of the output terminal 5 is consequently limited to VB+Vth.

The current thus flows from the output terminal via the slicing MOSFET to the inverted input terminal when the potential difference reaches the threshold level Vth as the voltage of the output terminal of the operational amplifier becomes higher than that of the inverted input terminal thereof. On the other hand, the current flows from the inverted input terminal via the MOSFET to the output terminal when the potential difference reaches the threshold level Vth as the voltage of the output terminal becomes lower than that of the inverted input terminal. In this way, the voltage of the output terminal is evenly limited to the threshold level Vth vertically in such a way as to center around the bias voltage VB.

Although a description has been given of the use of the PMOS 13 as MOSFET by way of example, NMOS may be used likewise to materialize the amplitude limiting amplifier circuit according to the present invention. With the use of the NMOS in place of the PMOS 13, however, the circuit involved is such that the first and the fourth analog switch 14, 17 are turned off and the second and the third analog switch 15, 16 are turned on when the voltage of the output terminal is higher than that of the inverted input terminal 3 and that the first and the fourth analog switch 14, 17 are turned on and the second and the third analog switch 15, 16 are turned off when the voltage of the output terminal 5 is lower than that of the inverted input terminal 3.

Figure 4:
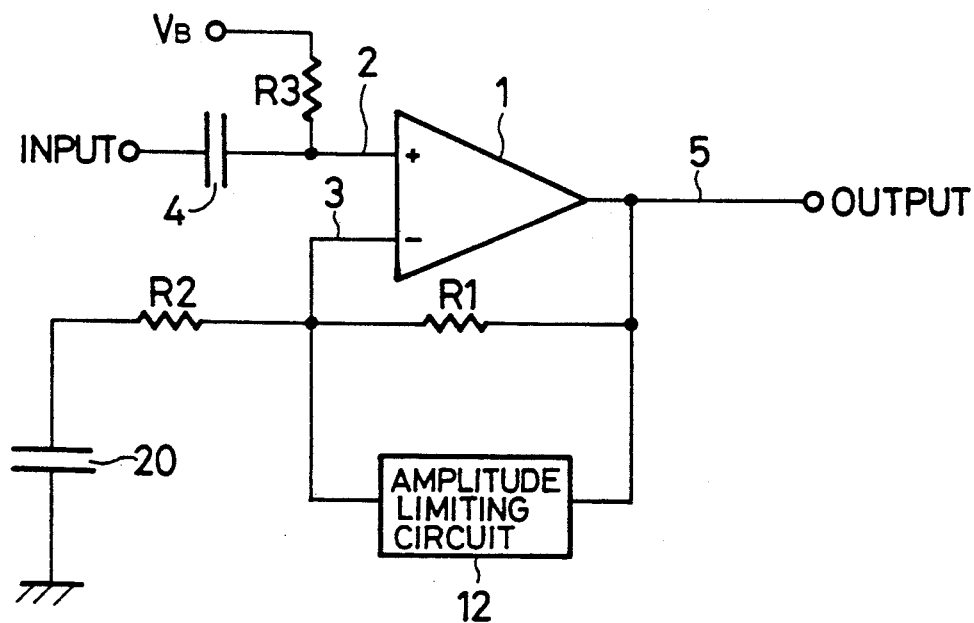
FIG. 4 is a circuit diagram of another amplitude limiting amplifier circuit embodying the present invention.
Figure 5:
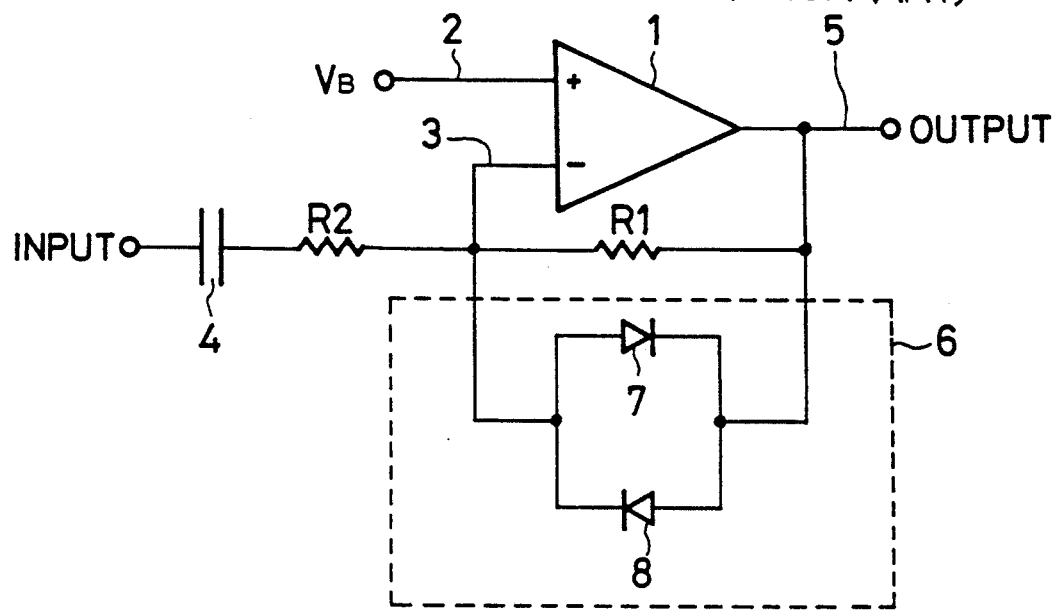
FIG. 5 is a circuit diagram of a conventional amplitude limiting amplifier circuit.
Figure 6:
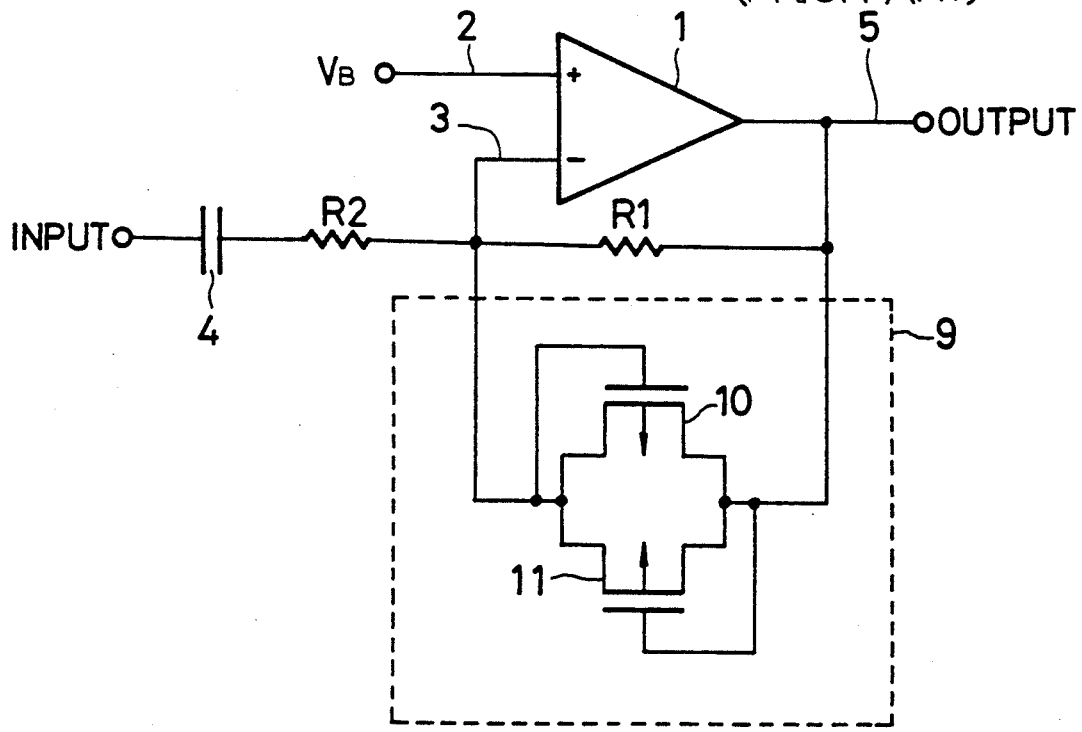
FIG. 6 is a circuit diagram of another conventional amplitude limiting amplifier circuit.

In that case, an inverted amplifier is used as the operational amplifier and an amplitude limiting circuit 12 is added thereto. However, a non-inverted amplifier may also be used as the operational amplifier and the amplitude limiting circuit 12 may be added thereto. FIG. 4 is a block diagram illustrating the application of the amplitude limiting circuit 12 to a non-inverted amplifier as another embodiment. As this embodiment is considered readily understandable from what has already been described by reference to FIG. 1, a detailed description will be omitted.

While one MOSFET is used for the slicing circuit, the four analog switches are selectively turned on and off in accordance with the relation between the voltages of the output terminal and inverted input terminal of the operational amplifier, so that the amplitude limiting amplifier circuit is capable of limiting the amplitude of the output signal evenly in the vertical direction. The current flows in such a way as to bypass the feedback resistor connected between the inverted input terminal and output terminal of the operational amplifier particularly when the amplitude limiting circuit in the preceding embodiment operates, whereby starting responsivity is made improvable as the capacitor for cutting the direct current is charged with electric charge.

What is claimed is:

1. An amplitude limiting amplifier circuit comprising:
    an operational amplifier having an inverted input terminal, a non-inverted input terminal and an output terminal;
    a MOSFET formed on a substrate having a back gate floating with respect to the substrate;
    the MOSFET having a back gate terminal connected to the back gate, a gate terminal, a source terminal and a drain terminal, wherein one of said drain and source terminals is connected to an input terminal, and the other of said drain and source terminals is connected to said output terminal;
    a first analog switch connected between the gate terminal and said inverted input terminal;
    a second analog switch connected between said gate terminal and said output terminal;
    a third analog switch connected between said back gate terminal and said inverted input terminal;
    a fourth analog switch connected between said back gate terminal and said output terminal; and
    control means for controlling said first, second, third and fourth analog switches dependent upon relative voltages of the output terminal and the inverted input terminal of the operational amplifier.

2. An amplitude limiting amplifier circuit as claimed in claim 1, wherein said back gate is a well region formed in said substrate.

3. An amplitude limiting amplifier circuit as claimed in claim 1, wherein said control means comprises a comparator for comparing the voltage of said output terminal with the voltage of said inverted input terminal on receiving these voltages and an invertor for inverting the output of said comparator, and wherein said control means applied the output of said comparator to a terminal for causing said first analog switch and said fourth analog switch to be turned "ON/OFF" and applied the output of said invertor to a terminal for causing said second analog switch and said third analog switch to be turned "ON/OFF".

4. Am amplitude limiting amplifier circuit as claimed in claim 3, wherein when a P-channel MOSFET is employed, said first analog switch and said fourth analog switch are turned "OFF" and said second analog switch and said third analog switch are turned "ON" when the voltage of said output terminal is lower than that of said inverted input terminal, and wherein said first analog switch and said fourth analog switch are turned "ON" and said second analog switch and said third analog switch are turned "OFF" when the voltage of said output terminal is higher than that of said inverted input terminal.

5. An amplitude limiting amplifier circuit comprising:
   an operational amplifier having an inverted input terminal, an non-inverted input terminal and an output terminal;
   a MOSFET formed on a substrate having a back gate floating with respect to the substrate;
   the MOSFET having a back gate terminal connected to the back gate, a gate terminal, a source terminal and a drain terminal, wherein one of said drain and source terminals is connected to an input terminal, and the other of said drain and source terminals is connected to said output terminal;
   a first analog switch connected between the gate terminal and said inverted input terminal;
   a second analog switch connected between said gate terminal and said output terminal;
   a third analog switch connected between said back gate terminal and said inverted input terminal;
   a fourth analog switch connected between said back gate terminal and said output terminal; and
   switch control circuit means for holding the first analog switch and the fourth analog switch in an "OFF" state while holding the second analog switch and the third analog switch in an "ON" state when the voltage of the output terminal is lower than the voltage of the inverted input terminal, and for further holding the first analog switch and the fourth analog switch in an "ON" state while holding the second analog switch and the third analog switch in an "OFF" state when the voltage of the output terminal is greater than the voltage of the inverted input terminal.

6. An amplitude limiting amplifier circuit as claimed in claim 5, wherein an input signal to be received is received by said non-inverted input terminal of said operational amplifier is what is derived from a sensor in a VTR.

7. An amplitude limiting amplifier circuit as claimed in claim 6, wherein the signal from the sensor is either a frequency signal or a control signal.

* * * * *